United States Patent
Lin et al.

(10) Patent No.: US 9,941,257 B2
(45) Date of Patent: Apr. 10, 2018

(54) EMBEDDED STACKED DIE PACKAGES AND RELATED METHODS

(71) Applicant: SEMICONDUCTOR COMPONENTS INDUSTRIES, LLC, Phoenix, AZ (US)

(72) Inventors: Yusheng Lin, Phoenix, AZ (US); Francis J. Carney, Mesa, AZ (US); Yenting Wen, Chandler, AZ (US); Chee Hiong Chew, Seremban (MY); Azhar Aripin, Subang Jaya (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/612,971

(22) Filed: Jun. 2, 2017

(65) Prior Publication Data
US 2018/0033777 A1   Feb. 1, 2018

Related U.S. Application Data

(63) Continuation of application No. 15/221,464, filed on Jul. 27, 2016, now Pat. No. 9,679,878.

(51) Int. Cl.
*H01L 25/07* (2006.01)
*H01L 23/00* (2006.01)
(Continued)

(52) U.S. Cl.
CPC ........ *H01L 25/074* (2013.01); *H01L 21/0273* (2013.01); *H01L 21/565* (2013.01);
(Continued)

(58) Field of Classification Search
CPC ............. H01L 21/76802; H01L 21/565; H01L 21/76877; H01L 21/0273; H01L 24/19; H01L 24/82
See application file for complete search history.

(56) References Cited

U.S. PATENT DOCUMENTS

| 8,237,259 | B2 | 8/2012 | Pressel |
| 2008/0136002 | A1* | 6/2008 | Yang ............... H01L 24/82 257/686 |
| 2013/0105991 | A1* | 5/2013 | Gan ............... H01L 25/105 257/777 |

OTHER PUBLICATIONS

A. Ostmann, A. Neumann, "Chip in Polymer, Next Step in Miniaturization", "Advancing Microelectronics", May 1, 2002, vol. 29, No. 3, Publisher: International Microelectronics Assembly and Packaging Society.

(Continued)

*Primary Examiner* — Kyoung Lee
(74) *Attorney, Agent, or Firm* — IPTechLaw

(57) ABSTRACT

Forming a semiconductor package includes coupling electrically conductive elements with a substrate, coupling a first die with one or more of the electrically conductive elements, and at least partially encapsulating the first die and electrically conductive elements in a first mold layer. A first redistribution layer (RDL) is placed over the first mold layer and electrically coupled with the first die. A second die is coupled with the first RDL, and the second die and first RDL are at least partially encapsulated in a second mold layer. A second RDL is formed over the second mold layer and is electrically coupled with the second die. A third mold layer at least partially encapsulates the second RDL. A portion of the substrate is removed to expose (and a solder mask is applied to) surfaces of the electrically conductive elements and of the first mold layer to form a stacked embedded package.

20 Claims, 12 Drawing Sheets

(51) Int. Cl.
*H01L 21/027* (2006.01)
*H01L 21/768* (2006.01)
*H01L 23/367* (2006.01)
*H01L 25/00* (2006.01)
*H01L 21/56* (2006.01)

(52) U.S. Cl.
CPC .. *H01L 21/76802* (2013.01); *H01L 21/76877* (2013.01); *H01L 23/3675* (2013.01); *H01L 24/19* (2013.01); *H01L 24/24* (2013.01); *H01L 24/82* (2013.01); *H01L 25/50* (2013.01); *H01L 2224/24145* (2013.01)

(56) References Cited

OTHER PUBLICATIONS

Global Semiconductor Alliance, "Embedded Die Packaging Technologies Enable Innovative 2D and 3D Structures for Portable Applications", "Forum", Mar. 1, 2014, pp. 1-20, vol. 21, No. 1, Publisher: Global Semiconductor Alliance.

E. D. Blackshear et al., "The evolution of build-up package technology and its design challenges", "IBM Journal of Research and Development", Jul. 1, 2005, pp. 641-661, vol. 49, No. 4/5.

* cited by examiner

EMBEDDED STACKED DIE PACKAGES AND RELATED METHODS

CROSS REFERENCE TO RELATED APPLICATIONS

This application is a continuation application of the earlier U.S. Utility Patent Application to Lin entitled "Embedded Stacked Die Packages and Related Methods," application Ser. No. 15/221,464, filed Jul. 27, 2016, the disclosure of which is hereby incorporated entirely herein by reference.

BACKGROUND

1. Technical Field

Aspects of this document relate generally to semiconductor packages. More specific implementations involve embedded stacked die semiconductor packages.

2. Background

Semiconductor devices, such as integrated circuits and the like, are often encased in one or more protective elements, such as a mold compound, protect the die and/or other elements from damage, moisture, contamination, and so forth. An (at least partially) encased semiconductor device, including the encasing or encapsulating compound, together with any electrical contacts exposed outside or through the encapsulating compound, is often called a package. In some cases, multiple die may be included in a single package.

SUMMARY

Implementations of methods of forming a semiconductor package (package) may include: coupling a plurality of electrically conductive elements with a substrate; coupling a first semiconductor die with one or more of the plurality of electrically conductive elements; at least partially encapsulating the first semiconductor die and the plurality of electrically conductive elements in a mold compound to form a first mold layer; forming a first redistribution layer (RDL) over the first mold layer, the first redistribution layer electrically coupled with the first semiconductor die; coupling a second semiconductor die with the first redistribution layer; at least partially encapsulating the second semiconductor die and the first redistribution layer in a mold compound to form a second mold layer; forming a second redistribution layer (RDL) over the second mold layer, the second redistribution layer electrically coupled with the second semiconductor die; at least partially encapsulating the second redistribution layer in a mold compound to form a third mold layer; removing at least a portion of the substrate from the plurality of electrically conductive elements and from the first mold layer, thereby exposing surfaces of the plurality of electrically conductive elements and surfaces of the first mold layer, and; applying a solder mask to portions of the exposed surfaces of the plurality of electrically conductive elements and to portions of the exposed surfaces of the first mold layer to form a stacked embedded package.

Implementations of methods of forming a semiconductor package (package) may include one, all, or any of the following:

Electrically coupling the first redistribution layer with one or more of the plurality of electrically conductive elements.

The first mold layer, the second mold layer, and the third mold layer may be formed using compression molding.

Coupling a third semiconductor die with one or more of the plurality of electrically conductive elements and at least partially encapsulating the third semiconductor die in the first mold layer.

The stacked embedded package may not include a sequential build-up (SBU) laminate substrate.

The stacked embedded package may include no bondwires and no electrically conductive clips.

Electrically coupling the first redistribution layer with the first semiconductor die through one or more electrically conductive pillars, electrically coupling the second redistribution layer with the second semiconductor die through one or more electrically conductive pillars, and electrically coupling the second redistribution layer with the first redistribution layer through one or more electrically conductive pillars.

Coupling a heat dissipation device with the second redistribution layer and at least partially encapsulating the heat dissipation device in the third mold layer, wherein a portion of the heat dissipation device is exposed on an outer surface of the package through an opening in the third mold layer.

Implementations of methods of forming a semiconductor package (package) may include: coupling a plurality of electrically conductive elements with a substrate; coupling a first semiconductor die with one or more of the plurality of electrically conductive elements; at least partially encapsulating the first semiconductor die and the plurality of electrically conductive elements in a mold compound to form a first mold layer; forming one or more first vias through the first mold layer to expose one or more surfaces of the first semiconductor die; at least partially filling the one or more first vias with an electrically conductive material to form one or more first pillars; forming a first redistribution layer (RDL) over the first mold layer, the first redistribution layer electrically coupled with the first semiconductor die through the one or more first pillars; coupling a second semiconductor die with the first redistribution layer; at least partially encapsulating the second semiconductor die and the first redistribution layer in a mold compound to form a second mold layer; forming one or more second vias through the second mold layer to expose one or more surfaces of the second semiconductor die; at least partially filling the one or more second vias with an electrically conductive material to form one or more second pillars; forming a second redistribution layer (RDL) over the second mold layer, the second redistribution layer electrically coupled with the second semiconductor die through the one or more second pillars; at least partially encapsulating the second redistribution layer in a mold compound to form a third mold layer; removing at least a portion of the substrate from the plurality of electrically conductive elements and from the first mold layer, thereby exposing surfaces of the plurality of electrically conductive elements and surfaces of the first mold layer, and; applying a solder mask to portions of the exposed surfaces of the plurality of electrically conductive elements and to portions of the exposed surfaces of the first mold layer to form a stacked embedded package.

Implementations of methods of forming a semiconductor package (package) may include one, all, or any of the following:

Electrically coupling the first redistribution layer with one or more of the plurality of electrically conductive elements.

The first mold layer, the second mold layer, and the third mold layer may be formed using compression molding.

Coupling a third semiconductor die with one or more of the plurality of electrically conductive elements and at least partially encapsulating the third semiconductor die in the first mold layer.

The stacked embedded package may include no sequential build-up (SBU) laminate substrates, no bondwires, and no electrically conductive clips.

Forming one or more second vias through the second mold layer may expose one or more surfaces of the first redistribution layer and the second redistribution layer may be electrically coupled with the first redistribution layer through the one or more second pillars.

Coupling a heat dissipation device with the second redistribution layer and at least partially encapsulating the heat dissipation device in the third mold layer, wherein a portion of the heat dissipation device is exposed on an outer surface of the package through an opening in the third mold layer.

Implementations of methods of forming a semiconductor package (package) may include: coupling a plurality of electrically conductive elements with a substrate; coupling a first semiconductor die with one or more of the plurality of electrically conductive elements; at least partially coating the first semiconductor die and the plurality of electrically conductive elements with a photoresist material to form a first photoresist layer; patterning the first photoresist layer to form one or more first vias exposing one or more surfaces of the first semiconductor die; at least partially filling the one or more first vias with an electrically conductive material to form one or more first pillars; removing the first photoresist layer; at least partially encapsulating the first semiconductor die, the plurality of electrically conductive elements, and the one or more first pillars in a mold compound to form a first mold layer; forming a first redistribution layer (RDL) over the first mold layer, the first redistribution layer electrically coupled with the first semiconductor die; coupling a second semiconductor die with the first redistribution layer; at least partially coating the second semiconductor die and the first redistribution layer with a photoresist material to form a second photoresist layer; patterning the second photoresist layer to form one or more second vias exposing one or more surfaces of the second semiconductor die; at least partially filling the one or more second vias with an electrically conductive material to form one or more second pillars; removing the second photoresist layer; at least partially encapsulating the second semiconductor die, the first redistribution layer, and the one or more second pillars in a mold compound to form a second mold layer; forming a second redistribution layer (RDL) over the second mold layer, the second redistribution layer electrically coupled with the second semiconductor die through the one or more second pillars; at least partially encapsulating the second redistribution layer in a mold compound to form a third mold layer; removing at least a portion of the substrate from the plurality of electrically conductive elements and from the first mold layer, thereby exposing surfaces of the plurality of electrically conductive elements and surfaces of the first mold layer, and; applying a solder mask to portions of the exposed surfaces of the plurality of electrically conductive elements and to portions of the exposed surfaces of the first mold layer to form a stacked embedded package.

Implementations of methods of forming a semiconductor package (package) may include one, all, or any of the following:

Electrically coupling the first redistribution layer with one or more of the plurality of electrically conductive elements.

The first mold layer, the second mold layer, and the third mold layer may be formed using compression molding.

Coupling a third semiconductor die with one or more of the plurality of electrically conductive elements and at least partially encapsulating the third semiconductor die in the first mold layer.

The stacked embedded package may include no sequential build-up (SBU) laminate substrates, no bondwires, and no electrically conductive clips.

Forming the one or more second vias through the second photoresist layer may expose one or more surfaces of the first redistribution layer, and the method may further include electrically coupling the second redistribution layer with the first redistribution layer through the one or more second pillars.

The second redistribution layer may be coupled with one or more of the plurality of electrically conductive elements through the one or more second pillars and through the first redistribution layer.

Coupling a heat dissipation device with the second redistribution layer and at least partially encapsulating the heat dissipation device in the third mold layer, wherein a portion of the heat dissipation device is exposed on an outer surface of the package through an opening in the third mold layer.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended embedded stacked die packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such embedded stacked die packages and related methods, and implementing components and methods, consistent with the intended operation and methods.

Figure 13:
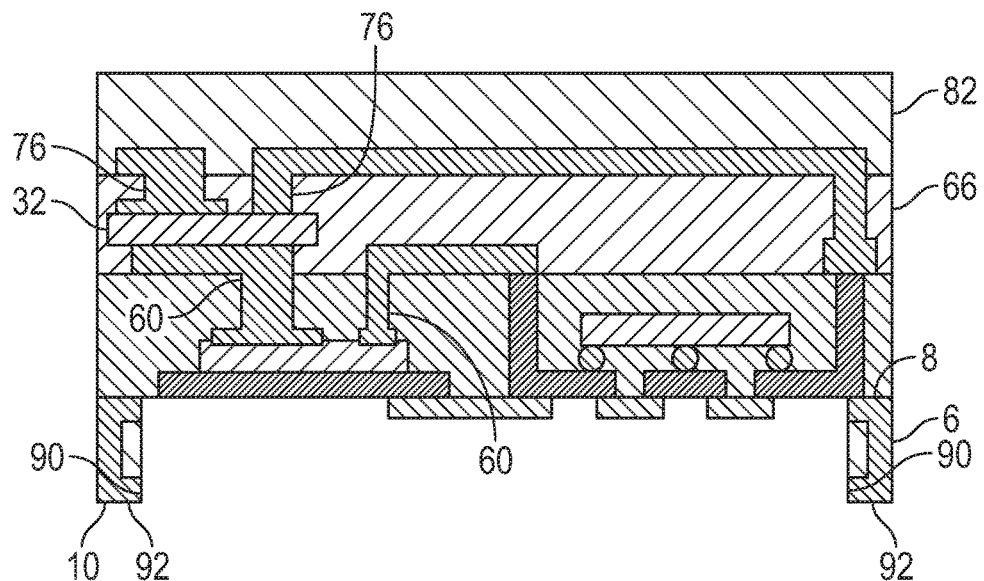
FIG. 13 representatively illustrates another processing step used in the first method of forming the semiconductor package of FIGS. 14 and 31.
Figure 14:
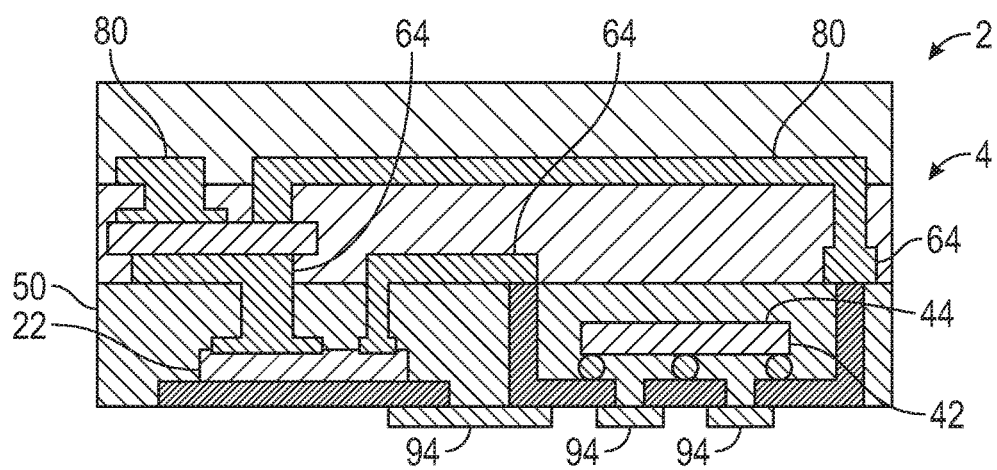
FIG. 14 shows a cross-section view of a semiconductor package formed using the processing steps representatively illustrated in FIGS. 1-13.

Referring now to FIGS. 1-14, an implementation of a process for forming a semiconductor package (package) 2 is illustrated. The completed package is shown in FIG. 14. The package is a stacked embedded package 4 and includes a plurality of electrically conductive elements 12 including horizontal members 14 and vertical members 16. A first semiconductor die (die) 22 is coupled over one of the horizontal members and electrically conductive pillars (first pillars) 60 couple the first die with a first redistribution layer (first RDL) 64. The first die, first pillars and horizontal members are included within a first mold layer 50 of the package. A second mold layer 66 atop the first mold layer includes a second semiconductor die (die) 32 and electrically conductive pillars (second pillars) 76 coupling the second die with a second redistribution layer (second RDL)—the second RDL is included in a third mold layer 82. A third semiconductor die (die) 42 is coupled with one or more of the horizontal members and/or vertical members and is within the first mold layer. The first RDL electrically couples the first die with the third die through one of the vertical members and electrically couples the first die with the second die. The second die and third die are electrically coupled through a path that includes the second redistribution layer, an electrically conductive pillar (pillar) 79 between the second redistribution layer and first redistribution layer, the first redistribution layer, and one of the vertical members, and one of the horizontal members. A number of solder masks 94 are coupled at a bottom of the package over portions of the first mold layer and portions of the horizontal members.

Figure 31:
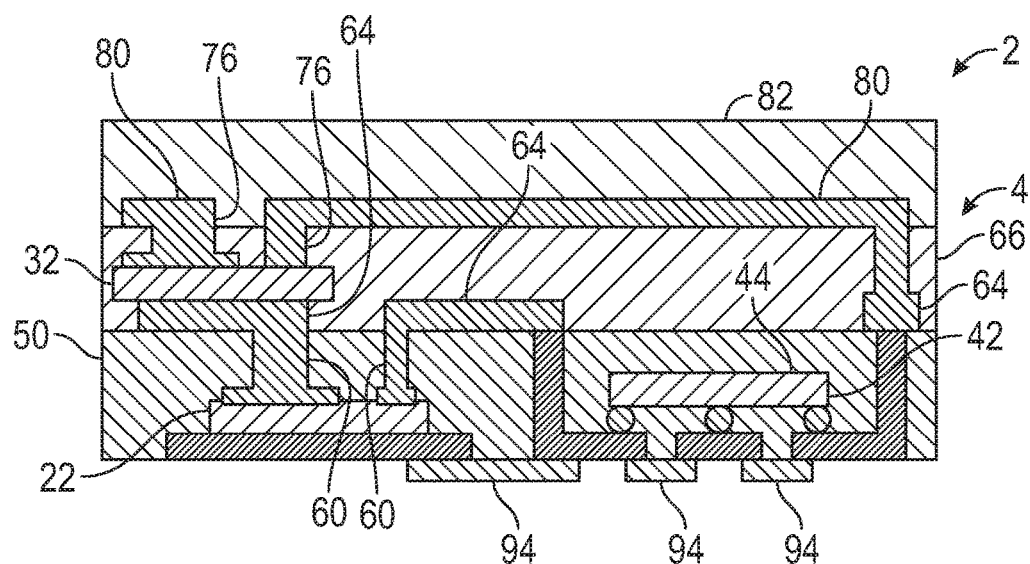
FIG. 31 shows a cross-section view of a semiconductor package formed using the processing steps representatively illustrated in FIGS. 15-30.

FIG. 31 shows a semiconductor package 2 which is similar to package 2 shown in FIG. 14, but the package shown in FIG. 14 is formed using a first process or method representatively illustrated in FIGS. 1-14 while the package of FIG. 31 is formed using a second process or method representatively illustrated in FIGS. 15-31, as will now be described.

Figure 1:
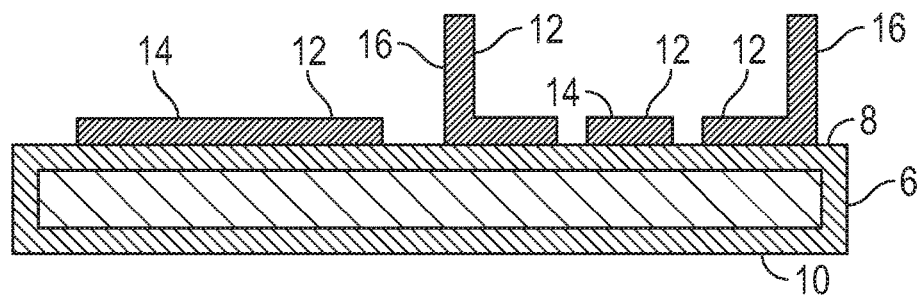
FIG. 1 representatively illustrates a processing step used in a first method of forming the semiconductor package of FIGS. 14 and 31.

Referring to FIG. 1, a first method of forming a semiconductor package 2 includes forming, on a first surface 8 of a substrate 6, a number of electrically conductive elements 12. The electrically conductive elements include horizontal members 14 and vertical members 16. The substrate has a second surface 10 opposite the first surface. The substrate could be formed of any material and one or both of the substrate and electrically conductive elements could be included in a pre-formed frame. The electrically conductive elements could be formed of any metal or other electrically conductive material. Various processing techniques may be used to form the elements 12, including deposition, sputtering, electroplating, electroless plating, etching, and related photolithography and/or masking steps.

A first semiconductor die (die) (first die) 22 is coupled over one of the horizontal members so that at least one electrical contact of the first die is electrically coupled therewith. Any type of die could be used, such as an insulated gate bipolar transistor (IGBT), a field-effect transistor (FET), a metal-oxide-semiconductor FET (MOSFET), a bipolar junction transistor (BJT), and so forth, but in the implementation shown the first die is a FET 24 and is configured in the package so that it is a high-side FET (HSFET) relative to one or more other FETs. FET 24 has gate, source and drain contacts, with one of these three contacts coupled with one of the horizontal members.

Figure 2:
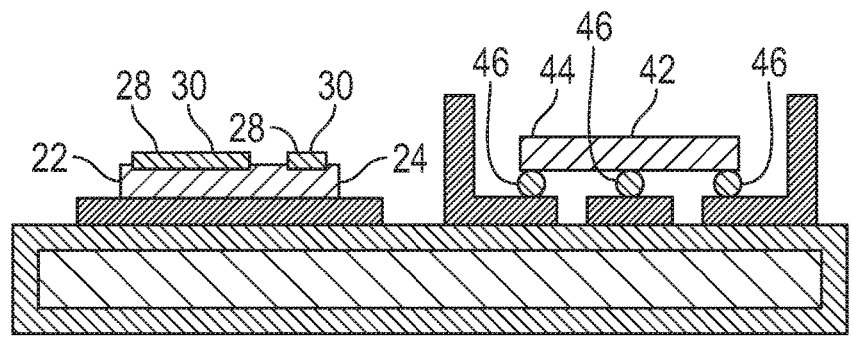
FIG. 2 representatively illustrates another processing step used in the first method of forming the semiconductor package of FIGS. 14 and 31.
Figure 3:
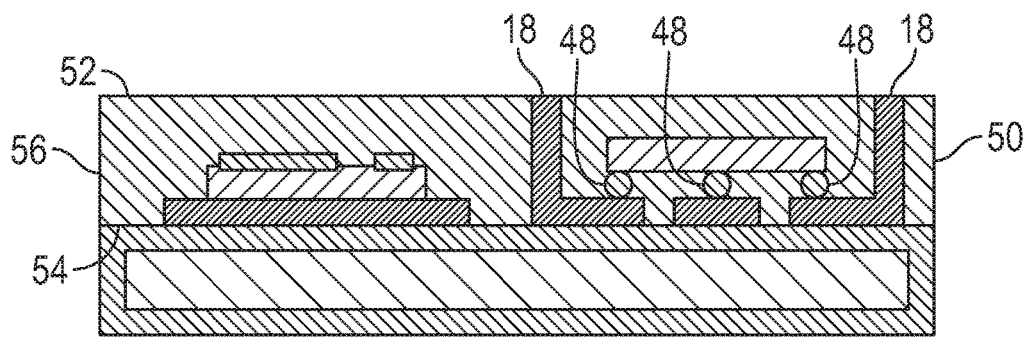
FIG. 3 representatively illustrates another processing step used in the first method of forming the semiconductor package of FIGS. 14 and 31.

A second semiconductor die (die) (second die) will be described hereafter, but in implementations a third semiconductor die (die) (third die) 42 is coupled with one or more of the horizontal and vertical members as shown in FIG. 2. As FIG. 2 shows, the third die is electrically coupled with three horizontal members and two vertical members (the left and right vertical members are in turn each integrally formed with one of the horizontal members each). The third die 42 is a driver 44 and could be formed using any type of die as described above with respect to the first die. In FIG. 2 the third die is a FET driver. In the implementation shown the third die has gate, source and drain contacts all on one side or surface of the die, so that electrical couplers 46 (all of which are solder bumps 48 in the representative example) are all located on one side of the die to couple those contacts with the electrically conductive elements 12. In other configurations the third die could be flipped and coupled with the electrically conductive elements 12 using wire bonds.

The different die configurations, such as the first die having electrical contacts or pads on two sides of the die, and the third die having electrical contacts or pads on only one side of the die, are only representative examples to show that the configuration of the electrically conductive elements 12 may be configured to receive either type of die, and that any die of the package could have either configuration. Thus, any of the first die, third die, and (hereafter described) second die (along with any other die included in the package) could have electrical contacts/pads or the like on only one side/surface or could have them on multiple surfaces/sides, including opposing surfaces/sides as shown with respect to the representative example of the first die.

In implementations the electrically conductive elements could be glued, adhered using an adhesive, soldered, bonded, or otherwise coupled with the substrate. The first die could be coupled with its corresponding horizontal member using, by non-limiting example, solder paste and a heating stage.

Figure 4:
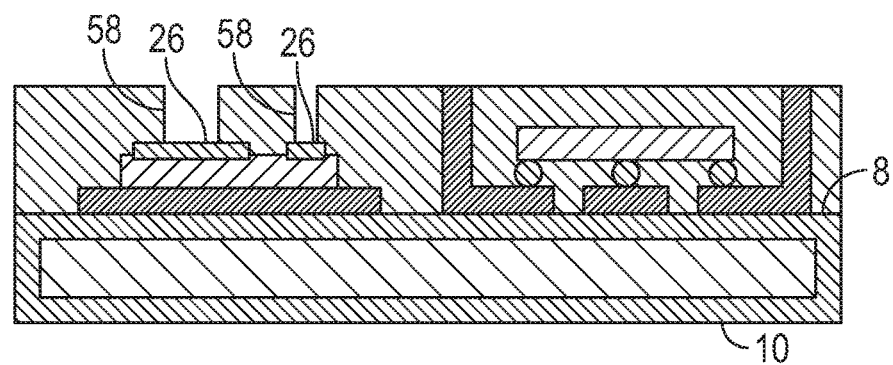
FIG. 4 representatively illustrates another processing step used in the first method of forming the semiconductor package of FIGS. 14 and 31.

Once the first die and third die are in place, they are at least partially encapsulated in a first mold layer (overmold) 50. The first mold layer has a first surface 52 and a second surface 54 opposite the first surface, and is formed of a mold compound 56. After the molding process a grinding/polishing process may be used to grind down the encapsulant/mold to a desired level such as to form exposed surfaces 18 of the vertical members and/or to make them flush with the top of the first mold layer. One or more first vias 58 are formed to expose surfaces 26 of electrical contacts 28 of the first die as shown in FIG. 4. As described previously, the first die is only a representative example of one die configuration, so in the instant case where the first die has electrical contacts on its upper side vias may be formed to access them, while if the first die were configured as the third die no vias would be needed and instead the contacts could be formed using one or more vertical members. The electrical contacts 28 of the first die are pads 30, though in other implementations they could have other configurations. The first vias could be formed using a laser drill process, though other processes such as selective etching could be used.

Figure 5:
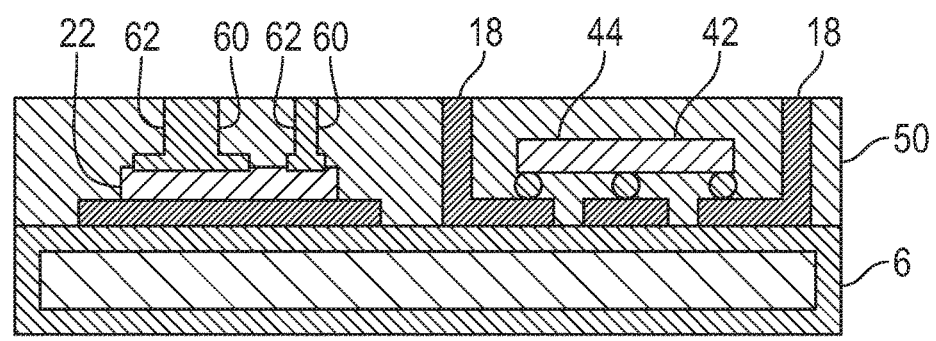
FIG. 5 representatively illustrates another processing step used in the first method of forming the semiconductor package of FIGS. 14 and 31.

A plating or other deposition process is then used to form electrically conductive pillars (first pillars) 60 in the first mold layer coupled with the pads of the first die, as shown in FIG. 5. The first pillars fill the first vias. Any type of plating or material deposition technique could be used, such as electroplating or electroless plating, sputtering, chemical vapor deposition (CVD), and so forth. The first pillars may be formed of any electrically conductive material 62. A second grinding process may then be done to level the upper surface of the first mold layer with the upper surfaces of the vertical members and the first pillars so that they are all flush with one another.

Figure 6:
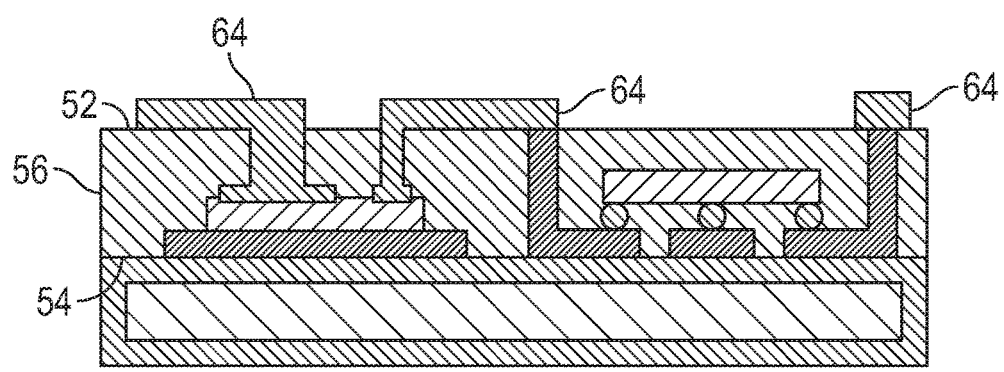
FIG. 6 representatively illustrates another processing step used in the first method of forming the semiconductor package of FIGS. 14 and 31.

A first redistribution layer (first RDL) 64 is formed atop the upper surface of the first mold layer as shown in FIG. 6. This may be formed with any electrically conductive material using any material deposition technique, and in the representative example is formed of copper using a plating process (such as electroplating or electroless plating). FIG. 6 shows that, in the representative example, the first die and third die are coupled with one another through a path including one of the first pillars, a portion of the first RDL, and one of the vertical members. Thus, the first RDL may be used to electrically couple the first and third die, and (as will be shown hereafter) may also be utilized to couple the first and second die and/or the second and third die.

Figure 7:
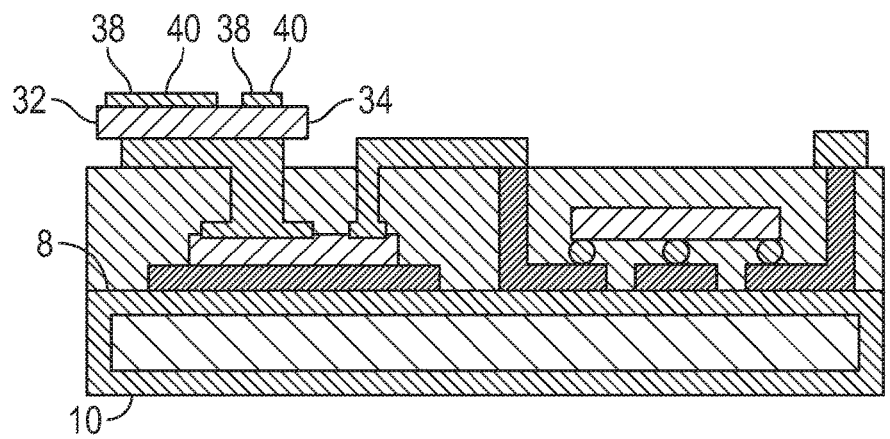
FIG. 7 representatively illustrates another processing step used in the first method of forming the semiconductor package of FIGS. 14 and 31.

FIG. 7 shows a second semiconductor die (die) (second die) 32 that is coupled with the first RDL so that it is electrically coupled with the first die. The second die in the implementation shown has electrical contacts 38 on two sides, similar to the representative example of the first die, but in other implementations it could have a configuration similar to the third die where it has electrical contacts only on one side of the die and other elements of the package (vias, RDLs, etc.) could be configured to still make the appropriate electrical couplings between the various die and/or other package elements. The electrical contacts of the second die are pads 40 in the drawings, but in other implementations they could have other configurations. The second die could be any type of die as described previously with respect to other die, but in the implementation shown it is a FET 34 which is configured in the package to be a low side FET (LSFET) relative to one or more other die of the package.

Figure 8:
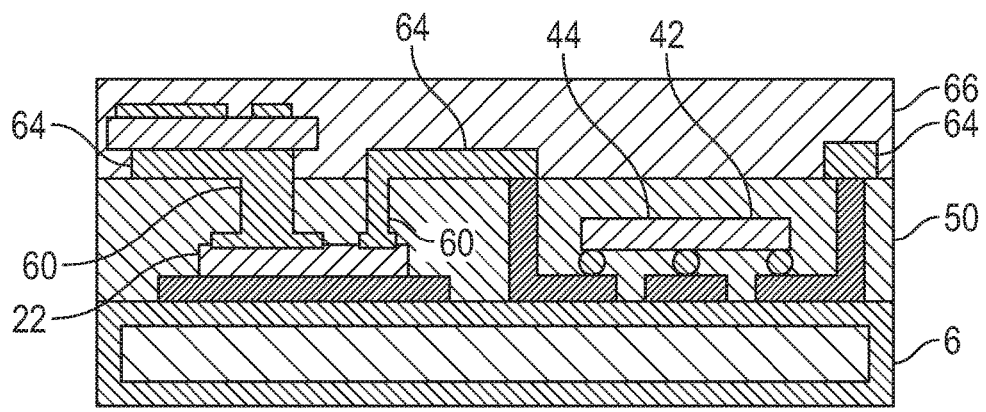
FIG. 8 representatively illustrates another processing step used in the first method of forming the semiconductor package of FIGS. 14 and 31.

A second mold layer (overmold) 66 is used to at least partially encapsulate the second die and the first RDL, as shown in FIG. 8. The second mold layer is formed of a mold compound 72 (which may be the same or a different mold compound than the first mold layer) and has a first surface 68 and a second surface 70 opposite the first surface.

Figure 9:
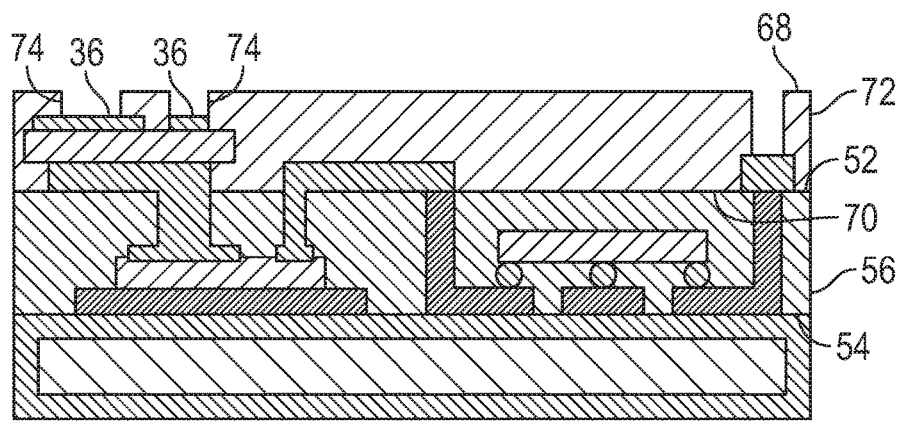
FIG. 9 representatively illustrates another processing step used in the first method of forming the semiconductor package of FIGS. 14 and 31.
Figure 10:
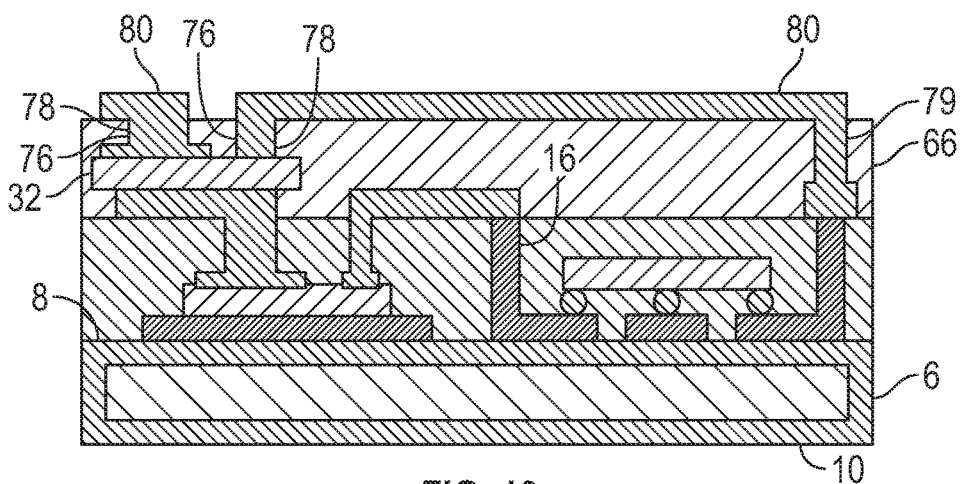
FIG. 10 representatively illustrates another processing step used in the first method of forming the semiconductor package of FIGS. 14 and 31.

One or more second vias 74 are formed in the second mold layer, using any processes described above with respect to the first vias, to expose surfaces 36 of the second die and/or the first RDL. Three second vias 74 are shown in FIG. 9 though the rightmost via is not labeled. Electrically conductive pillars (second pillars) 76 and electrically conductive pillar 79 are formed, using any of the methods described above for the first pillars, and the pillars fill in the second vias as shown in FIG. 10. FIG. 10 also shows a second redistribution layer (second RDL) 80 which is later applied, but first the pillars 76 and 79 are formed. After the pillars 76 and 79 are formed a third grinding process may be used to level the top surface of the second mold layer and the exposed upper surfaces of the pillars 76 and 79. The pillars 76 and 79 are formed of an electrically conductive material 78.

The second RDL 80 may be formed using any of the processes described above for the first RDL. FIG. 10 shows that the second RDL electrically couples the second die with the third die through a path including the pillars 76, the second RDL, pillar 79, the first RDL, one of the vertical members, and one of the horizontal members. Other couplings may be made, for instance the second RDL may also couple the leftmost upper contact of the second die shown in FIG. 10 with one or more other elements internal to or external to the package.

Figure 11:
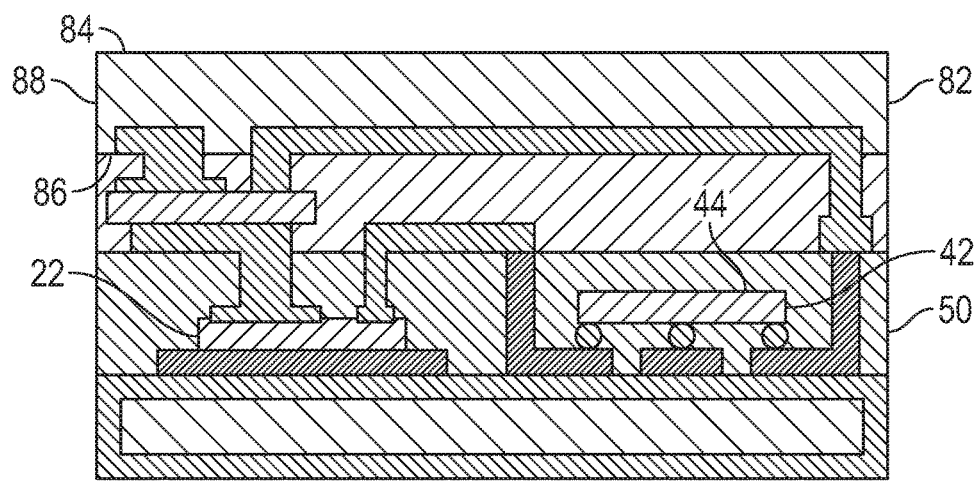
FIG. 11 representatively illustrates another processing step used in the first method of forming the semiconductor package of FIGS. 14 and 31.

FIG. 11 shows that a third mold layer (overmold) 82 is used to at least partially encapsulate the second RDL. The third mold layer is formed of a mold compound 88, which could be the same material as the first and/or second mold layers or could be formed of a different material. The third mold layer has a first surface 84 and a second surface 86 opposite the first surface.

Figure 12:
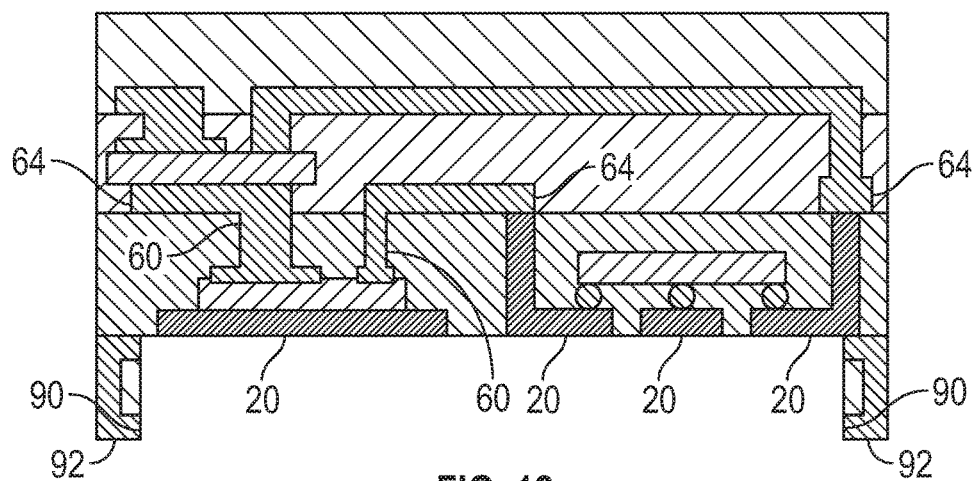
FIG. 12 representatively illustrates another processing step used in the first method of forming the semiconductor package of FIGS. 14 and 31.

FIG. 12 shows that material is removed from the substrate to form a through hole 90, forming exposed surfaces 20 of the horizontal members and vertical members and of the first mold layer. This may be done using any material removal techniques, such as laser drilling, etching, and so forth. In the representative example an etching process is used. Strips 92 of the substrate are left intact to facilitate further processing. Solder masks 94 are applied, as shown in FIGS. 13-14, to cover some areas of the bottom surface of the assembly and to prevent solder balls and/or solder paste in different areas from contacting one another when the horizontal and vertical members are later coupled with a motherboard, printed circuit board (PCB), or some other element. Any type of solder mask material may be used for the solder masks.

In FIG. 14, the strips 92 have been removed, and the package 2 is fully formed. As is seen in FIG. 14, the package is a three-dimensional (3D) stacked-die embedded package—with the first and third die located within a first mold layer and the second die located within a second mold layer atop the first mold layer. The methods described herein are therefore used, at least in part, to stack the die within the package. The pillars described above are, in the representative example, copper pillars—though in other implementations other electrically conductive materials could be used. As described above, the package may be coupled with a PCB or other element using solder or other coupling mechanisms. The configuration of FIG. 14 shows that either side (top or bottom) of any die may be coupled with either side (top or bottom) of any other die using the RDLs, pillars, and/or the horizontal/vertical members.

FIGS. 15-31 show a second method of forming semiconductor package (package) 2. FIG. 31 shows the completed package which is similar to FIG. 14 which has already been previously described.

Figure 15:
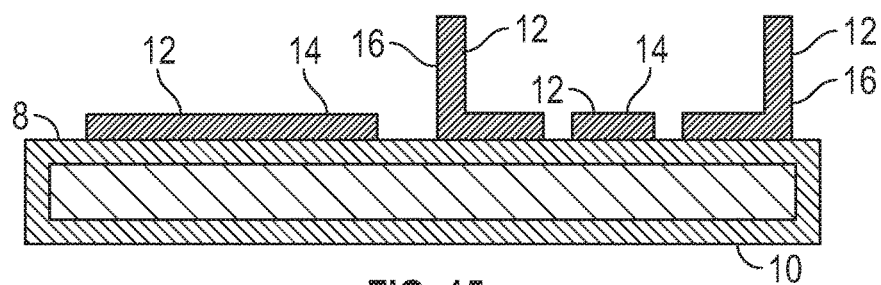
FIG. 15 representatively illustrates a processing step used in a second method of forming the semiconductor package of FIGS. 14 and 31.
Figure 16:
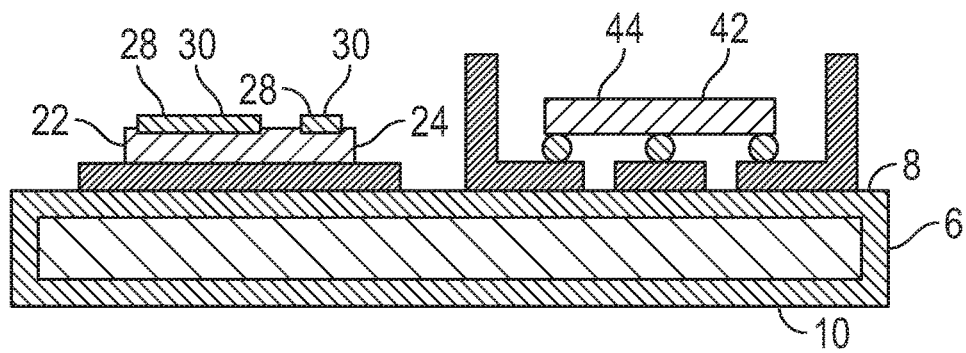
FIG. 16 representatively illustrates another processing step used in the second method of forming the semiconductor package of FIGS. 14 and 31.

Referring to FIG. 15, the substrate is provided and electrically conductive elements including horizontal members and vertical members are coupled therewith, as previously described. FIG. 16 shows placement of the first and third die, which is similar to the previously described process.

Figure 17:
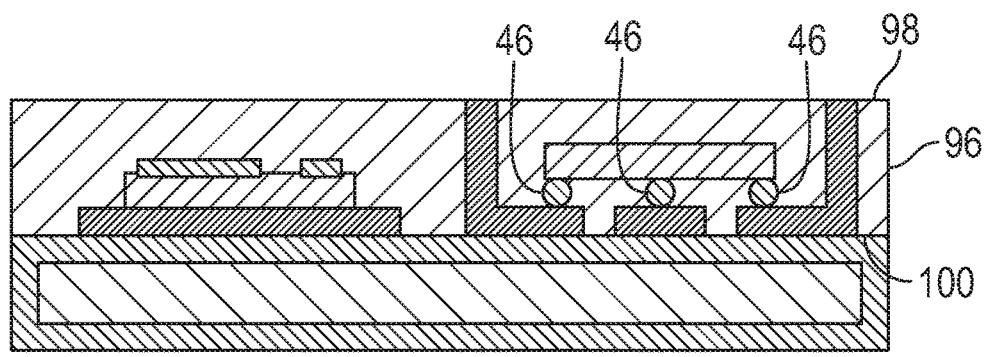
FIG. 17 representatively illustrates another processing step used in the second method of forming the semiconductor package of FIGS. 14 and 31.
Figure 18:
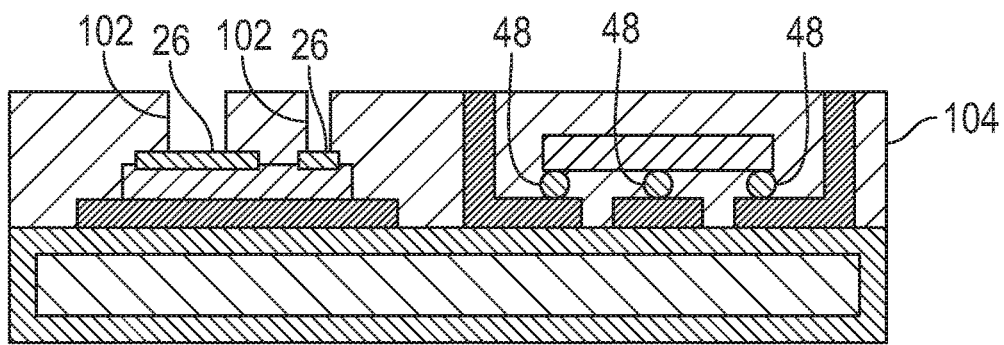
FIG. 18 representatively illustrates another processing step used in the second method of forming the semiconductor package of FIGS. 14 and 31.
Figure 19:
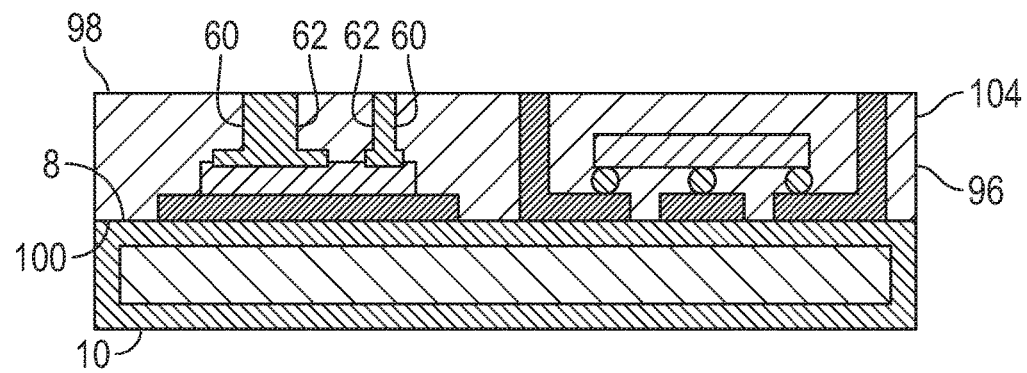
FIG. 19 representatively illustrates another processing step used in the second method of forming the semiconductor package of FIGS. 14 and 31.
Figure 20:
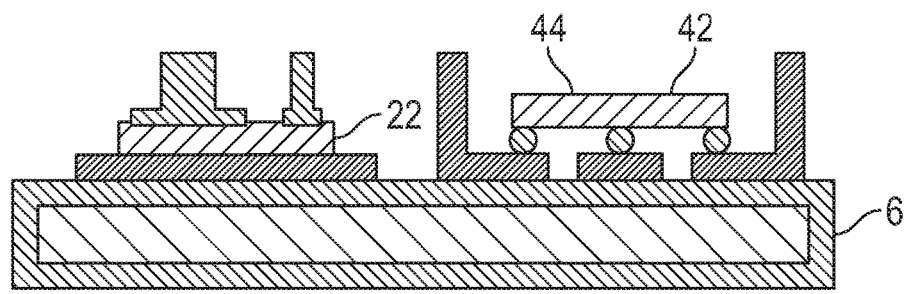
FIG. 20 representatively illustrates another processing step used in the second method of forming the semiconductor package of FIGS. 14 and 31.

FIG. 17 shows a first photoresist layer 96 that has been formed to at least partially encapsulate or cover the first and third die and most of the electrically conductive elements. The first photoresist layer is formed of a photoresist material 104 and has a first surface 98 and a second surface 100 opposite the first surface. FIG. 18 shows first vias 102 formed in the first photoresist layer. These may be formed by patterning and exposing portions of the photoresist layer and removing some of the photoresist material after the exposure. FIG. 19 shows first pillars formed using any of the methods previously described, which fill the first vias, and in FIG. 20 the first photoresist layer is fully removed using known processes.

Figure 21:
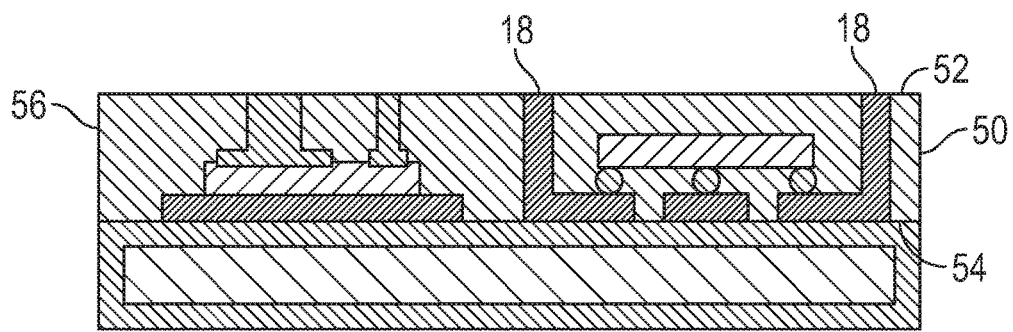
FIG. 21 representatively illustrates another processing step used in the second method of forming the semiconductor package of FIGS. 14 and 31.
Figure 22:
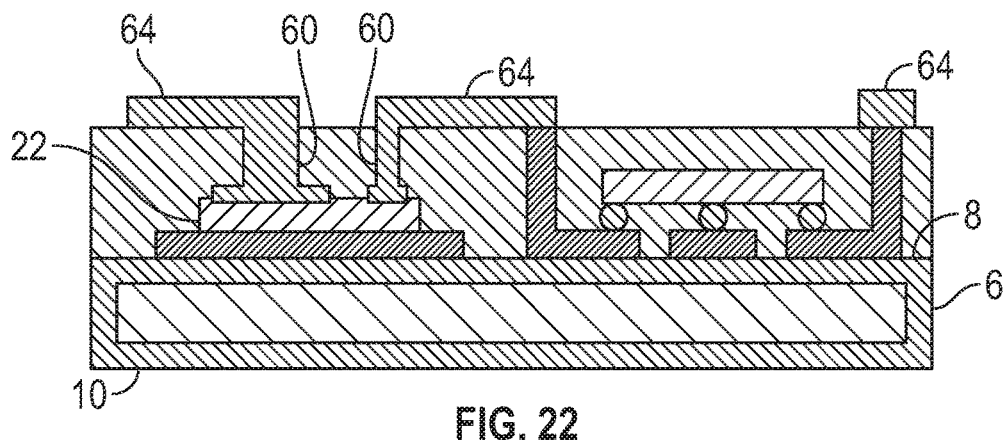
FIG. 22 representatively illustrates another processing step used in the second method of forming the semiconductor package of FIGS. 14 and 31.
Figure 23:
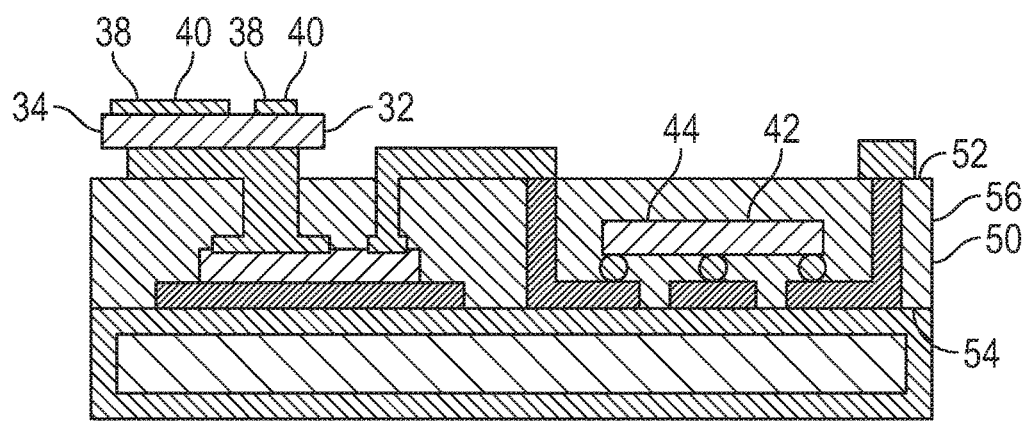
FIG. 23 representatively illustrates another processing step used in the second method of forming the semiconductor package of FIGS. 14 and 31.

In FIG. 21 the first mold layer is applied and then a grinding process may be performed so that the upper surfaces of the pillars, first mold layer, and vertical members are flush. Thus, at the method stage shown in FIG. 21 the partially formed package may have the same configuration as that shown in FIG. 5 of the previous method. FIGS. 22-23 likewise show similar configurations and processes as were described previously with respect to FIGS. 6-7, respectively.

Figure 24:
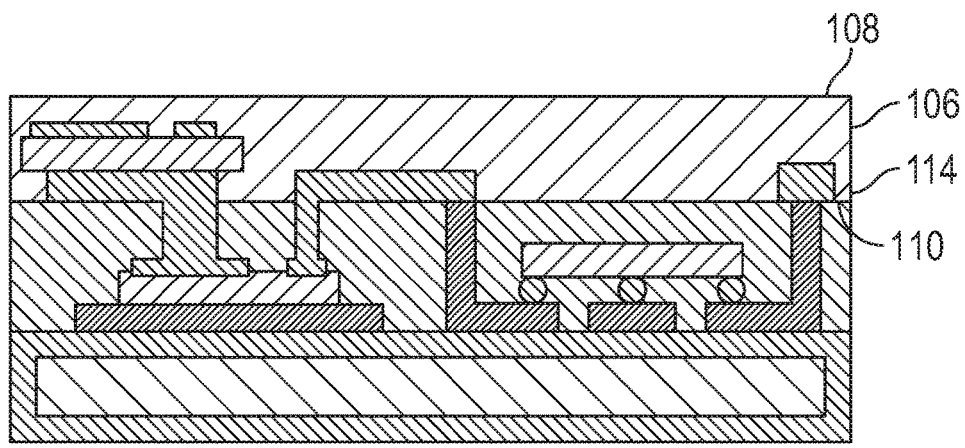
FIG. 24 representatively illustrates another processing step used in the second method of forming the semiconductor package of FIGS. 14 and 31.
Figure 25:
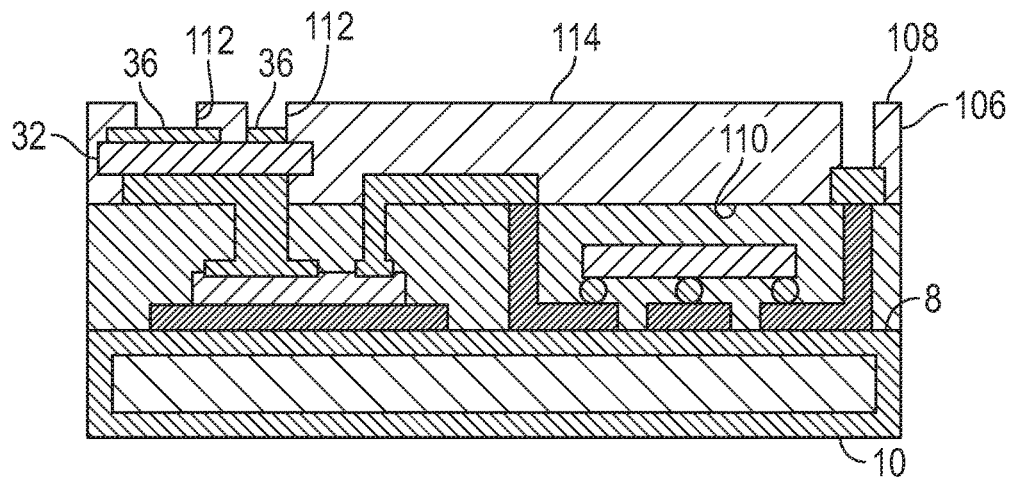
FIG. 25 representatively illustrates another processing step used in the second method of forming the semiconductor package of FIGS. 14 and 31.
Figure 26:
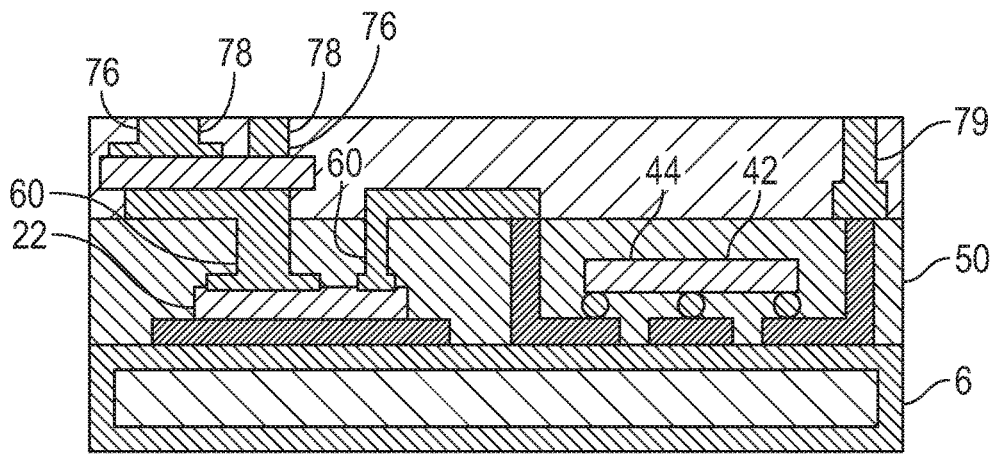
FIG. 26 representatively illustrates another processing step used in the second method of forming the semiconductor package of FIGS. 14 and 31.
Figure 27:
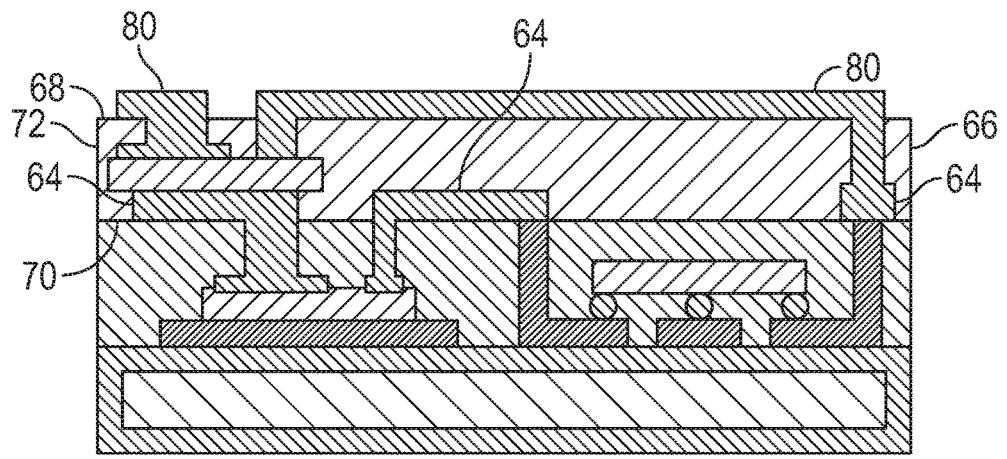
FIG. 27 representatively illustrates another processing step used in the second method of forming the semiconductor package of FIGS. 14 and 31.
Figure 28:
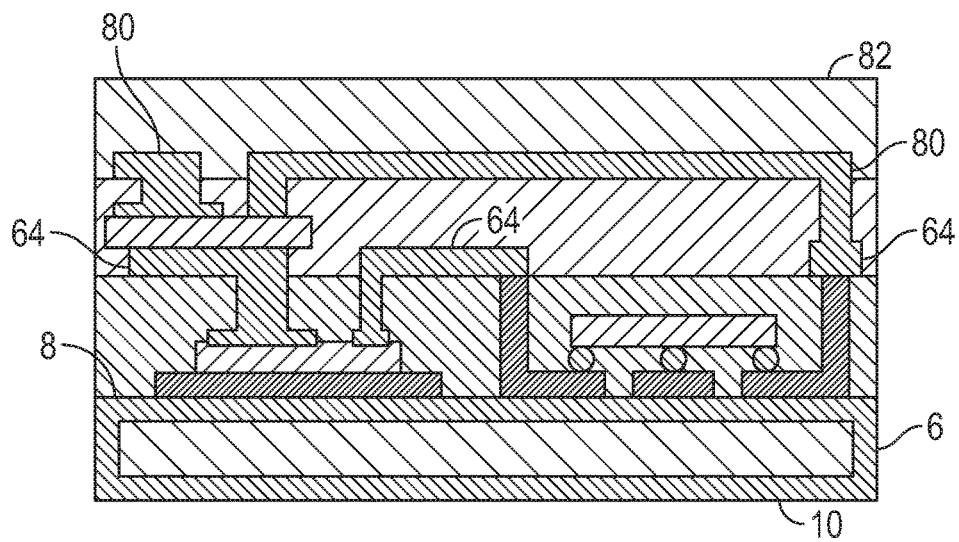
FIG. 28 representatively illustrates another processing step used in the second method of forming the semiconductor package of FIGS. 14 and 31.
Figure 29:
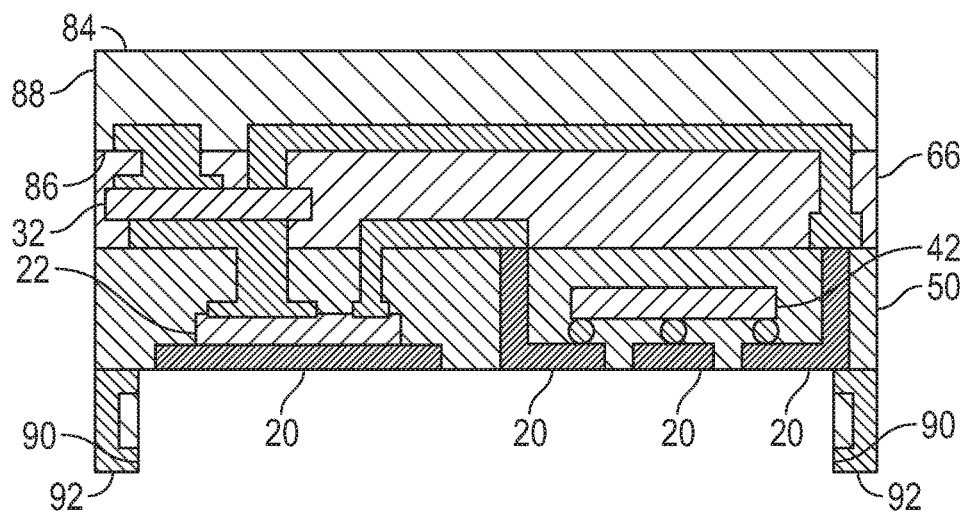
FIG. 29 representatively illustrates another processing step used in the second method of forming the semiconductor package of FIGS. 14 and 31.
Figure 30:
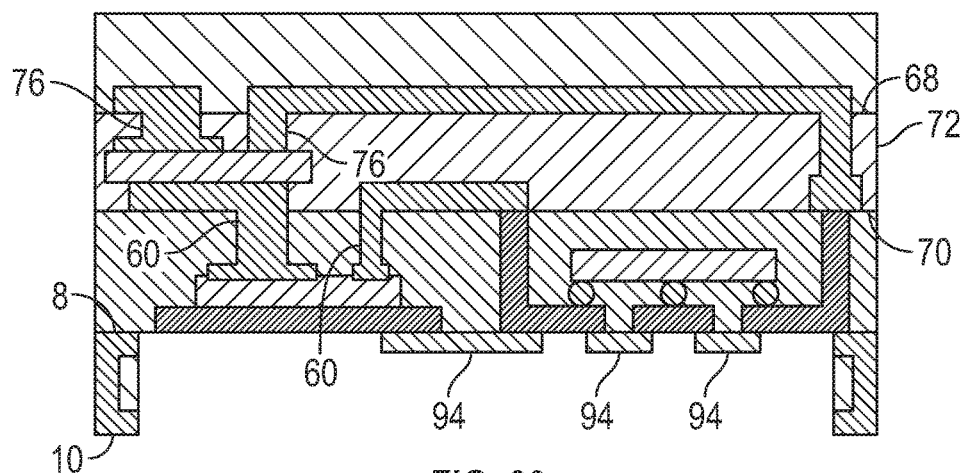
FIG. 30 representatively illustrates another processing step used in the second method of forming the semiconductor package of FIGS. 14 and 31.

At FIG. 24 a second photoresist layer 106 is applied. The second photoresist layer is formed of a photoresist material 114 and includes a first surface 108 and a second surface 110. Second vias 112 are formed in the second photoresist layer, using any of processes described above, as shown in FIG. 25. Three second vias 112 are shown in FIG. 25 though the rightmost via is not labeled. The second vias expose the electrical contacts of the second die and expose the first RDL (using the rightmost via). Pillars 76/79 are then formed, using any of the processes described above, filling the second vias, as shown in FIG. 26. The second photoresist layer is then fully removed and the second mold layer is applied.

After this, processing continues as shown in FIGS. 27-31 similar to that already described above for FIGS. 10-14, respectively. In FIG. 31 the completed package 2 is shown, which to package 2 of FIG. 14, but made using a different process.

Figure 32:
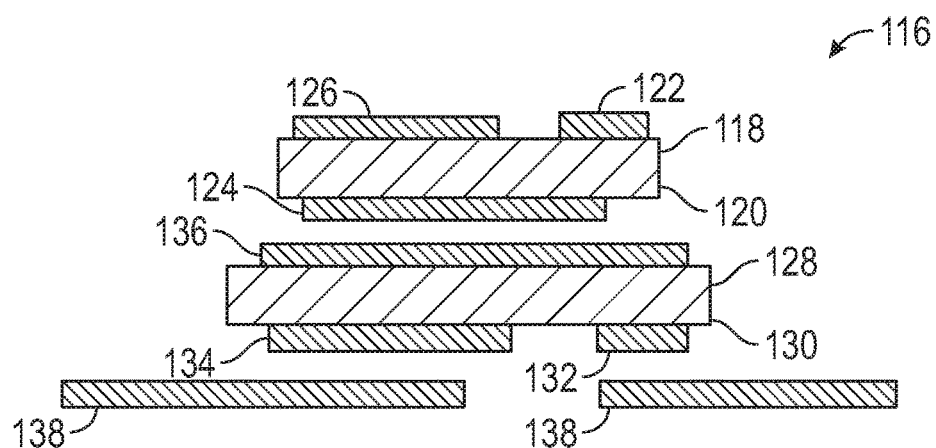
FIG. 32 shows a cross-section view of elements of another semiconductor package.

As described to some extent previously, in implementations the first die is an HSFET and the second die is an LSFET. In other implementations these could be reversed such as is shown with the elements 116 of FIG. 32 with the top FET 118 being an HSFET 120 and the bottom FET 128 being an LSFET 130. Electrical couplers 138 are shown which will be coupled with the gate contact 132 and source contact 134 of the LSFET. The drain contact 136 of the LSFET will be coupled with the source contact 124 of the HSFET. The gate contact 122 and drain contact 126 of the HSFET may be coupled with other elements internal or external to the package. The couplings between the electrical couplers 138, HSFET, and LSFET are not shown, but may be formed using any of the previously described techniques, such that the LSFET may be formed in a first mold layer, the HSFET in a second mold layer, and so forth, with pillars coupling the various elements—though these elements are not shown in FIG. 32. In other implementations one or more of these elements could be directly stacked and/or soldered together (or otherwise mechanically/electrically coupled) without using pillars. The electrical couplers 138 could be part of a molded interconnect device (MID).

The methods described herein may be utilized to form an embedded package within a PCB or may be used to form an independent, stand-alone package. In various implementations, one of the basic and novel aspects of the methods of forming a package described herein is the formation of the package without any PCB lamination steps/processes. In various implementations, one of the basic and novel aspects of the methods of forming a package described herein is the formation of the package without using any sequential build-up (SBU) laminate substrate and without using SBU lamination processes. An SBU laminate substrate as used herein is defined as a multilayer core substrate configured to receive laminated build-up layers on both a first side and a second side opposite the first side. SBU lamination processes are defined herein as coupling one or more die with a multilayer core substrate and adding one or more build-up layers through a lamination process to a first side of the multilayer core and adding one or more build-up layers through a lamination process to a second side of the multilayer core opposite the first side.

In implementations any of the solder masks described herein could be excluded and the remaining elements (such as all elements shown in FIG. 14 or 31 except the solder mask 94) may form the completed package. Any of the mold layers described herein may be formed using compression molding.

In implementations the packages described herein could include one or more multi-chip modules (MCMs) instead of or in addition to the HSFET/LSFET die described herein. In some cases, multiple die and/or other elements could be mechanically and/or electrically coupled using the same conductive pillar. The electrically conductive material of any given pillar could be the same or different as that of other pillar. The first and second photoresist layers described above could be formed of the same or of different photoresist materials.

In implementations, as may be seen in the drawings, no wires and no clips are used in the formation of the package (s) described herein, and there are no wires and no clips in the completed package(s). As seen in the drawings, forming any of the vias described herein may expose surfaces of the die and/or surfaces of one or more of the RDLs.

Figure 33:
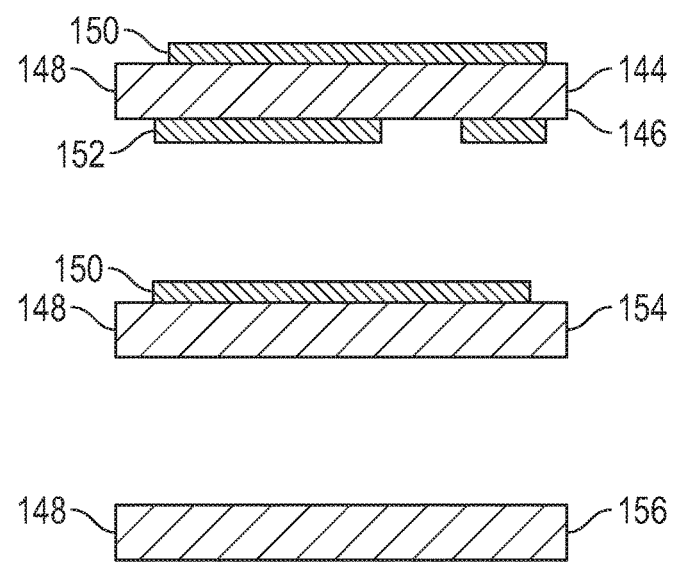
FIG. 33 shows cross-section views of three implementations of heat dissipation devices.
Figure 34:
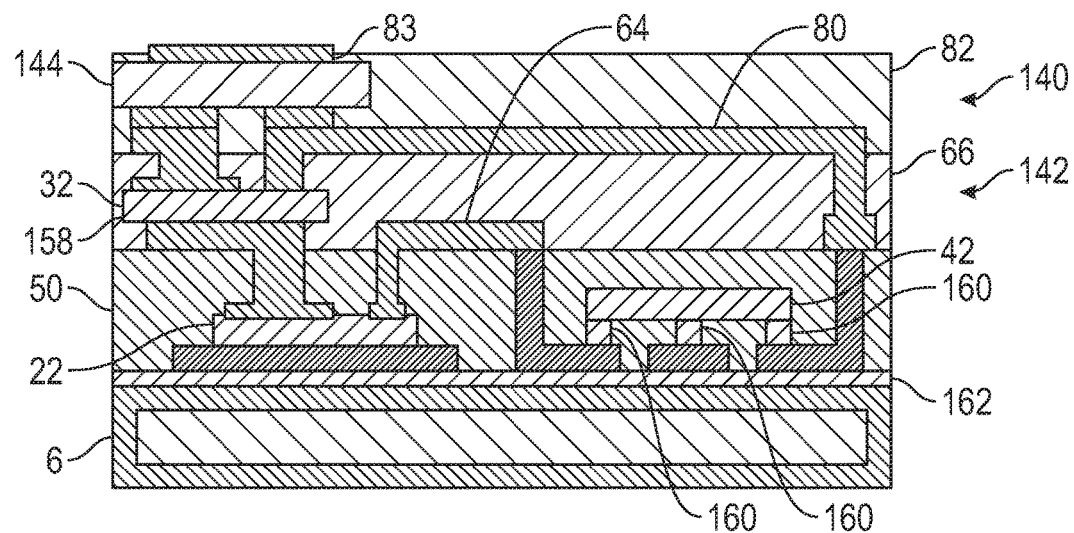
FIG. 34 shows a cross-section view of an implementation of a semiconductor package including a heat dissipation device.

Implementations of semiconductor packages may further include one or more elements for heat dissipation. Referring now to FIG. 34, a semiconductor package (package) 140 is shown which is a stacked embedded package 142. Package 140 includes a heat dissipation device 144 which is also shown at the top of FIG. 33. Heat dissipation device 144 includes a direct bonded copper (DBC) substrate 146 which includes a ceramic layer 148 sandwiched between a first copper layer 150 and a second copper layer 152. The middle image of FIG. 33 shows a heat dissipation device 154 that includes the ceramic layer and the first copper layer but not the second copper layer. The bottom image of FIG. 33 shows a heat dissipation device 156 that includes the ceramic layer but no copper layers.

The ceramic layer of any of the heat dissipation devices could be formed of, by non-limiting example, $Al_2O_3$, $Si_3N_4$, or AlN. The one or more copper layers could be formed by plating, sintering, thick film deposition, or some other material deposition/bonding technique.

FIG. 34 shows that the heat dissipation device may be coupled with the second redistribution layer and at least partially encapsulated in the third mold layer, though with a portion of the heat dissipation device exposed at an outer surface of the package through an opening in the third mold layer. In the representative example shown in FIG. 34, an upper surface of the first copper layer 150 is exposed through an opening 83 in the third mold layer. Package 140 includes heat dissipation device 144, which is a DBC substrate with two copper layers. When such a heat dissipation device is used the second copper layer may be bonded with the second redistribution layer through soldering or sintering or any other method disclosed in this document. In implementations of packages that include heat dissipation devices 154 or 156, there is no second copper layer and the ceramic layer of the heat dissipation device may be bonded with the second redistribution layer using a thermally conductive adhesive, such as a thermally conductive epoxy or paste or the like.

Packages which include heat dissipation devices may be particularly useful when the second semiconductor die 32 is a power/high voltage die 158 as in FIG. 34, since a power semiconductor die may need greater heat dissipation than other semiconductor die. In implementations the heat dissipation device may act as a heat sink to draw heat away from the power semiconductor die. In implementations the electrical couplers 46 (or other electrical couplers), instead of being solder bumps 48, could be formed of electrically conductive pillars 160 as shown in FIG. 34. These could be any shape, such as cylindrical or cuboidal, and could be formed of any electrically conductive material, such as copper. In implementations of forming semiconductor packages one or more layers 162 may be formed between the electrically conductive elements 12 and the substrate 6 as seen in FIG. 34, such as an adhesive or the like, which may or may not be removed thereafter during the processing steps shown in FIGS. 12 and 29, respectively, though if the adhesive is electrically conductive than portions of it may be removed while other portions (directly below conductive elements 12) could remain, such as through one or more additional processing steps which may or may not include additional patterning/etching steps.

Any of the first vias 58 in the first mold layer, second vias 74 in the second mold layer, and/or second vias 112 in the second mold layer may be through-mold vias (TMVs) formed using, by non-limiting examples, a mechanical process and/or a chemical process, such as laser drilling, wet etching, plasma etching, or the like.

In places where the description above refers to particular implementations of embedded stacked die packages and related methods and implementing components, sub-components, methods and sub-methods, it should be readily apparent that a number of modifications may be made without departing from the spirit thereof and that these implementations, implementing components, sub-components, methods and sub-methods may be applied to other embedded stacked die packages and related methods.

What is claimed is:

1. A semiconductor package, comprising:
    a first semiconductor die coupled with one or more of a plurality of electrically conductive elements;
    the first semiconductor die and the plurality of electrically conductive elements at least partially directly encapsulated in a first mold layer;
    a first redistribution layer (RDL) coupled with the first mold layer, the first redistribution layer electrically coupled with the first semiconductor die;
    a second semiconductor die coupled with the first redistribution layer;
    the second semiconductor die and the first redistribution layer at least partially encapsulated in a second mold layer, wherein at least two sides of the first redistribution layer are covered by the second mold layer; and
    a second redistribution layer (RDL) coupled with the second mold layer, the second redistribution layer electrically coupled with the second semiconductor die and the second redistribution layer at least partially encapsulated in a third mold layer, wherein at least two sides of the second redistribution are covered by the third mold layer.

2. The package of claim 1, wherein the first redistribution layer is coupled with one or more of the plurality of electrically conductive elements.

3. The package of claim 1, wherein the first mold layer, the second mold layer, and the third mold layer are formed using compression molding.

4. The package of claim 1, further comprising a third semiconductor die coupled with one or more of the plurality of electrically conductive elements, the third semiconductor die at least partially encapsulated in the first mold layer.

5. The package of claim 1, wherein the package does not comprise a sequential build-up (SBU) laminate substrate.

6. The package of claim 1, wherein the package comprises no bondwires and no electrically conductive clips.

7. The package of claim 1, wherein the first redistribution layer is electrically coupled with the first semiconductor die through one or more electrically conductive pillars, the second redistribution layer is electrically coupled with the second semiconductor die through one or more electrically conductive pillars, and the second redistribution layer is electrically coupled with the first redistribution layer through one or more electrically conductive pillars.

8. The package of claim 1, further comprising a heat dissipation device coupled with the second redistribution layer, the heat dissipation device at least partially encapsulated in the third mold layer, wherein a portion of the heat dissipation device is exposed on an outer surface of the package through an opening in the third mold layer.

9. A semiconductor package, comprising:
a first semiconductor die coupled with one or more of a plurality of electrically conductive elements;
the first semiconductor die and the plurality of electrically conductive elements at least partially directly encapsulated in a first mold layer;
one or more first vias through the first mold layer at least partially filled with an electrically conductive material to form one or more first pillars;
a first redistribution layer (RDL) coupled with the first mold layer, the first redistribution layer electrically coupled with the first semiconductor die through the one or more first pillars;
a second semiconductor die coupled with the first redistribution layer;
the second semiconductor die and the first redistribution layer at least partially encapsulated in a second mold layer, wherein at least two sides of the first redistribution layer are covered by the second mold layer;
one or more second vias through the second mold layer at least partially filled with an electrically conductive material to form one or more second pillars; and
a second redistribution layer (RDL) coupled with the second mold layer, the second redistribution layer electrically coupled with the second semiconductor die through the one or more second pillars.

10. The method of claim 9, further comprising electrically coupling the first redistribution layer with one or more of the plurality of electrically conductive elements.

11. The package of claim 9, wherein the first mold layer, the second mold layer, and the third mold layer are formed using compression molding.

12. The package of claim 9, further comprising a third semiconductor die coupled with one or more of the plurality of electrically conductive elements, the third semiconductor die at least partially encapsulated in the first mold layer.

13. The package of claim 9, wherein the package does not comprise a sequential build-up (SBU) laminate substrate.

14. The package of claim 9, wherein the package comprises no bondwires and no electrically conductive clips.

15. The package of claim 9, wherein the second redistribution layer is electrically coupled with the first redistribution layer through the one or more second pillars.

16. The package of claim 9, further comprising a heat dissipation device coupled with the second redistribution layer, the heat dissipation device at least partially encapsulated in the third mold layer, wherein a portion of the heat dissipation device is exposed on an outer surface of the package through an opening in the third mold layer.

17. A semiconductor package, comprising:
a first semiconductor die coupled with one or more of a plurality of electrically conductive elements;
a third semiconductor die coupled with one or more of the plurality of electrically conductive elements;
the first semiconductor die, the third semiconductor die, and the plurality of electrically conductive elements at least partially encapsulated in a first mold layer;
a first redistribution layer (RDL) coupled with the first mold layer, the first redistribution layer electrically coupled with the first semiconductor die;
a second semiconductor die coupled with the first redistribution layer;
the second semiconductor die and the first redistribution layer at least partially encapsulated in a second mold layer, wherein at least two sides of the first redistribution layer are covered by the second mold layer; and
a second redistribution layer (RDL) coupled with the second mold layer, the second redistribution layer electrically coupled with the second semiconductor die and the second redistribution layer at least partially encapsulated in a third mold layer.

18. The package of claim 17, wherein the first redistribution layer is electrically coupled with one or more of the plurality of electrically conductive elements.

19. The package of claim 17, wherein the stacked embedded package comprises no sequential build-up (SBU) laminate substrates, no bondwires, and no electrically conductive clips.

20. The method of claim 17, further comprising a heat dissipation device coupled with the second redistribution layer.

* * * * *